United States Patent [19]

Tsutahara et al.

[11] Patent Number: 5,025,133
[45] Date of Patent: Jun. 18, 1991

[54] SEMICONDUCTOR WAFER HEATING DEVICE

[75] Inventors: Kouichirou Tsutahara; Hiroshi Tanaka, both of Itami City, Japan

[73] Assignee: Mitsubishi Denki Kabushiki Kaisha, Japan

[21] Appl. No.: 374,824

[22] Filed: Jul. 3, 1989

[30] Foreign Application Priority Data

Apr. 4, 1989 [JP] Japan .................................. 1-83974

[51] Int. Cl.⁵ .............................................. H05B 3/72
[52] U.S. Cl. .................................. 219/462; 392/339
[58] Field of Search ................ 219/462, 439, 530, 540,
219/378, 399, 10, 491, 7.5; 366/273, 274;
392/339, 346

[56] References Cited

U.S. PATENT DOCUMENTS

| 2,352,899 | 7/1944 | Karlson | 219/530 |
| 2,506,886 | 5/1950 | Okulitoh | 366/273 |
| 2,852,586 | 9/1958 | Steele | 366/273 |
| 3,452,973 | 7/1969 | Kawawa | 366/273 |
| 3,719,796 | 3/1973 | Abildtrup | 219/462 |
| 4,778,559 | 10/1988 | McNeilly | 219/462 |

FOREIGN PATENT DOCUMENTS

| 55-32416 | 8/1980 | Japan | 366/274 |
| 60-34727 | 2/1985 | Japan | 366/273 |
| 62-40380 | 2/1987 | Japan . | |
| 622115 | 4/1949 | United Kingdom | 366/274 |

OTHER PUBLICATIONS

Kaplan, L. H. et al., "High Uniformity Hot Plate . . . ", IBM Tech. Disc. Bull., vol. 25, No. 9, Feb. 1983, pp. 4750-3.

Primary Examiner—Teresa J. Walberg
Attorney, Agent, or Firm—Leydig, Voit & Mayer

[57] ABSTRACT

A semiconductor wafer heating device includes a hollow heating stage. A semiconductor wafer is disposed over one surface of the heating stage and a heater is provided over the other surface thereof. A fluid having an excellent heat conductivity which is filled in the hollow space of the heating stage is stirred uniformly. In consequence, the surface temperature of the heating stage can be made uniform without employing a thick heating stage, and an excellent temperature control of the heating stage can be ensured.

5 Claims, 4 Drawing Sheets

SEMICONDUCTOR WAFER HEATING DEVICE

BACKGROUND OF THE INVENTION

1. Field of the Invention

The present invention relates to a semiconductor wafer heating device, and more particularly, to a semiconductor wafer heating apparatus employed in vapor phase growth, oxidation, diffusion or annealing processes in the semiconductor manufacturing art.

2. Description of the Related Art

FIG. 1 is a schematic view of a vapor phase growth apparatus with a conventional semiconductor wafer heating device incorporated therein. In this apparatus, a semiconductor wafer placed on a heating stage 2 is heated. Reaction gas is injected toward the surface of the semiconductor wafer 1 from a gas head 3 while the semiconductor wafer 1 is being heated. A thin film is formed on the surface of the semiconductor wafer 1 by virtue of the thermal chemical reaction of the reaction gas. The non-reacted gas remaining in the apparatus is discharged to the outside of the apparatus from an exhaust port 5 of an exhaust chamber 4 disposed surrounding the gas head 3 and the heating stage 2. In the above-described apparatus, since the film growing rate is dependent on the temperature of the semiconductor wafer 1, the temperature of the latter, i.e., the surface temperature of the heating stage 2, must be maintained at a uniform value during the reaction in order to ensure that a uniform film will grow on the semiconductor wafer 1.

FIG. 2 schematically shows the structure of the conventional heating stage 2. In order to improve the uniformity of the temperature on a surface 2a of the heating stage 2, a heat equalizing plate 6 made of a material having a high coefficient of thermal conductivity is used as the heating stage 2, and a heater 7 is disposed uniformly over the rear surface of the heat equalizing plate 6, as shown in FIG. 3. Further, the heat equalizing plate 6 and the heater 7 are supported by means of supports 8 made of a material having a low coefficient of thermal conductivity to prevent escape of the heat. The heater 7 is connected to a power source 10 through terminals 9, and a thermo-couple 11 is inserted into the equalizing plate 6 from the rear surface thereof for measuring the temperature of the vicinity of the surface of the heat equalizing plate 6, the measured temperature being used for temperature control of the heating stage.

In the above-described type of semiconductor wafer heating device, attempts are made to make the heat emanating from the heater 7 uniform by virtue of the heat conduction. There is therefore a limit to the uniformity of the temperature of the heater 7. More specifically, heat escapes from the heater 7 uniformly disposed in a helical fashion, as shown in FIG. 3, through the supports 8 and the terminals 9, making the temperature of the heater 7 non-uniform. This problem involving the non-uniformity of the temperature of the heater 7 may be solved by employing a heat equalizing plate 6 having a substantial thickness t. However, such a thick heat equalizing plate 6 increases the heat retaining capacity of the overall heating stage 2 making control of the surface temperature of the semiconductor wafer 1 difficult. That is, the thick heat equalizing plate 6 makes it difficult for the surface temperature of the semiconductor wafer 1 to be maintained constant when it is subjected to disturbances which are represented by changes in the ambient temperature.

FIGS. 4 (a) and 4 (b) are respectively graphs showing the difficulty involved in controlling the temperature of the heating stage 2 when it is subjected to a disturbance indicated by A on the basis of the relationship between time and the surface temperature of the heating stage 2. FIG. 4 (a) illustrates a case in which a heating stage 2 comprises a thin heat equalizing plate 6 (having a small heat retaining capacity) and FIG. 4 (b) explains a case in which a heating stage 2 of a thick heat equalizing plate 6 (having a large heat retaining capacity) is used. It is, however, to be noted that in both cases the heater 7 has the same capacity. As will be seen from the graphs, in the case of a large heat retaining capacity, there is a time lag between the heating of the heater 7 and the heating of the surface of the heating stage 2, thus delaying the temperature recovery. It also increases the possibility that the phenomenon called overshoot may occur, the phenomenon representing the tendency for periodic deviation of the temperature of the heating stage 2 from the set value.

Thus, in the conventional semiconductor wafer heating device, only the effect of heat conduction is utilized to make the surface temperature of the heating stage 2 uniform. This requires a thick heat equalizing plate 6 and makes control of the temperature thereof difficult.

SUMMARY OF THE INVENTION

The present invention is directed to obviating the above-described problems of the related art, and an object thereof is to provide a semiconductor wafer heating device which is capable of heating a semiconductor wafer uniformly, which requires a small heat retaining capacity, and which ensures easy control of the temperature.

To this end, the present invention provides a semiconductor wafer heating device which comprises a hollow heating stage on one surface of which a semiconductor wafer is placed; a fluid having a high coefficient of thermal conductivity disposed in the hollow heating stage; means for stirring the fluid uniformly; and a heating means disposed over the other surface of the heating stage for heating it.

DETAILED DESCRIPTION OF THE PREFERRED EMBODIMENTS

Figure 5:
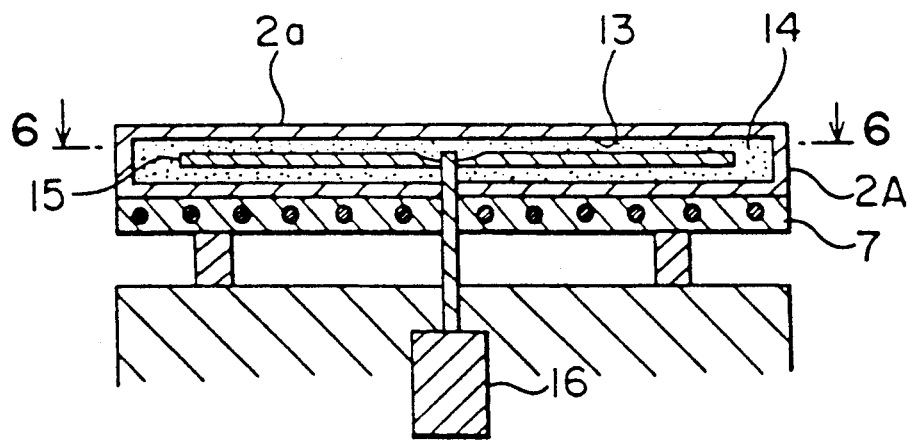
FIG. 5 is a schematic cross-sectional view of a semiconductor wafer heating device showing a first embodiment of the present invention.
Figure 6:
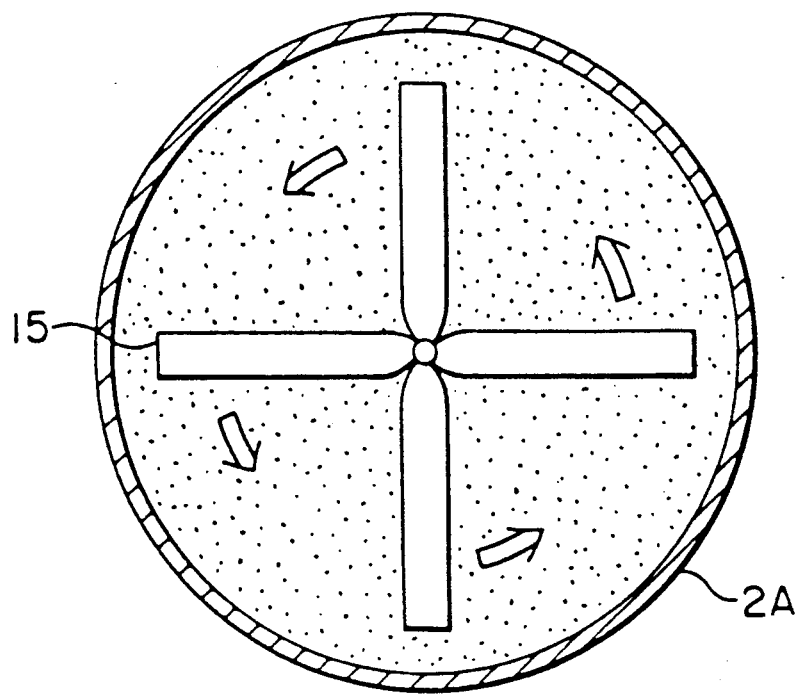
FIG. 6 is a sectional view taken along the line A—A of FIG. 5.

Referring to FIGS. 5 and 6, a heating stage 2A is provided on a heating means 7 for heating the heating stage 2A, e.g., a heater. The heating stage 2A is composed of a hollow disk having at least two parallel plane surfaces. A semiconductor wafer (not shown) is placed on a surface 2a of the heating stage 2A which includes an inner volume or space 13. A fluid having an excellent heat conductivity, e.g., liquid metal such as mercury 14, fills this inner space 13. A rotary propeller 15 is provided in the inner space 13 to forcibly and uniformly stir the mercury 14. The rotary propeller 15 is rotated by a driving means, e.g., a motor 16, provided outside of the heating stage 2A.

In the semiconductor wafer heating device arranged in the above-described manner, once the rear surface of the heating stage 2A is heated by the heater 7 the mercury 14 in the heating stage 2A is heated by virtue of the heat conduction. Since the mercury 14 has excellent heat conductivity, the surface of the heating stage 2A is relatively uniformly heated because of the conduction of heat through the mercury 14. However, since non-uniformity of the heat emanating from the heater 7 cannot be completely eliminated by virtue of the conduction of heat, the mercury 14 is stirred by the rotation of the rotary propeller 15 to maintain the temperature of the mercury 14 and, hence, the temperature of the surface 2a of the heating stage 2A constant.

This embodiment employs the mercury 14 as a fluid having an excellent heat conductivity. However, other fluids having a high coefficient of heat conductivity may also be used. Further, the rotary propeller 15 is rotated only in one fixed direction. However, the direction of the rotation of the rotary propeller may be switched over for certain time intervals so that the mercury 14 can be stirred more effectively. In other words, the rotary propeller 1 may be rotated in either way, i.e., in one direction or in two directions, to maintain the temperature of the mercury 14 uniform.

As stated above, in this embodiment, the heat emanating from the heater which is a heating means is made uniform by virtue of the movement of the fluid as well as by means of the heat conduction. In consequence, the surface temperature of the heating stage can be made uniform without employing a thick heating stage, and easy temperature control of the heating stage is ensured. This results in the provision of a semiconductor wafer heating device which is capable of heating a semiconductor wafer uniformly, which requires a small heat retaining capacity, and which ensures easy temperature control.

Figure 7:
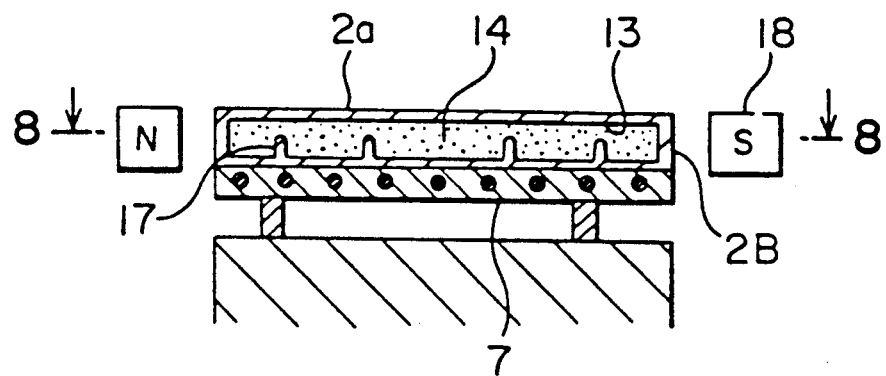
FIG. 7 is a schematic view of a semiconductor wafer heating device showing another embodiment of the present invention.
Figure 8:
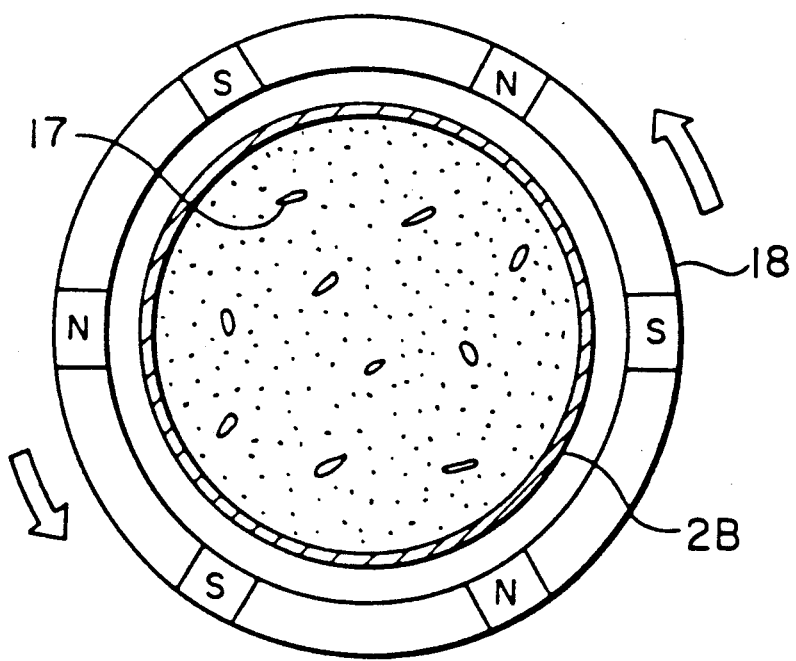
FIG. 8 is a sectional view taken along the line B—B of FIG. 7.

Turning to FIGS. 7 and 8, a second embodiment of the present invention will be described below. In this embodiment, a heating stage 2B is provided on a heating means 7 for heating the heating stage 2B, e.g., a heater. A semiconductor wafer (not shown) is placed on a surface 2a of the heating stage 2B having an inner volume or space 13. An electrically conductive fluid, e.g., a liquid metal such as mercury 14 fills in this inner space 13. Fins, e.g., fixed fins 17, are provided in the inner space 13. The mercury 14 is forcibly and uniformly stirred by a rotary magnetic field generating device, e.g., a magnet ring 18, disposed around the heating stage 18. The magnetic ring 18 may be a ring with magnets disposed alternately. A rotary magnetic field is applied to the mercury 14 by the rotation of this magnet ring 18.

In the semiconductor wafer heating device arranged in the above-described manner, once the rear surface of the heating stage 2B is heated by the heater 7, the mercury 14 in the heating stage 2B is heated by virtue of the heat conduction. Since the mercury 14 has excellent heat conductivity, the surface of the heating stage 2B is relatively uniformly heated because of the conduction of heat through the mercury 14. However, since non-uniformity of the heat emanating from the heater 7 cannot be completely eliminated by means of the heat conduction, a rotary magnetic field is applied to the mercury 14 by the rotation of the magnet ring 18, inducing eddy currents in the mercury 14. The mercury 14 starts rotating in a spiral fashion by virtue of the electromagnetic force caused by the magnetic field and is thereby stirred sufficiently by the fixed fins 17, making the temperature of the mercury 14 uniform. Once the temperature of the mercury 14 is made uniform, the surface temperature of the heating stage 2B is also made uniform, as in the first embodiment.

Figure 1:
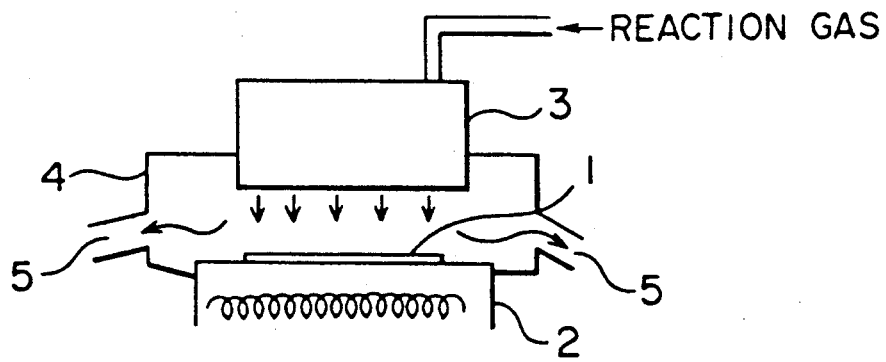
FIG. 1 is a schematic view of a vapor phase growth apparatus with a conventional semiconductor wafer heating device incorporated therein.
Figure 2:
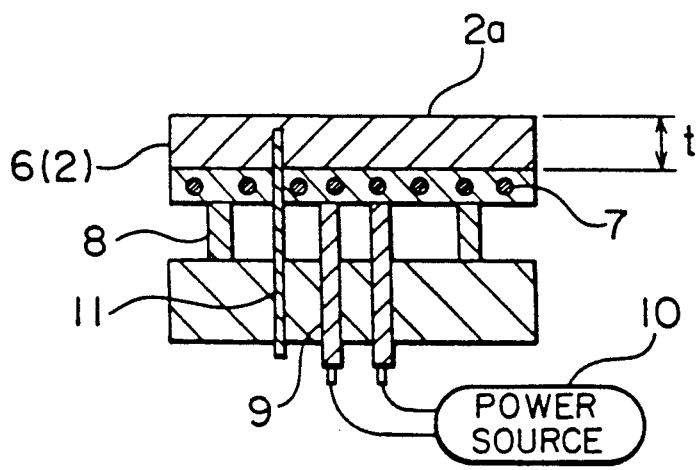
FIG. 2 is a schematic view of the heating stage of FIG. 1.
Figure 3:
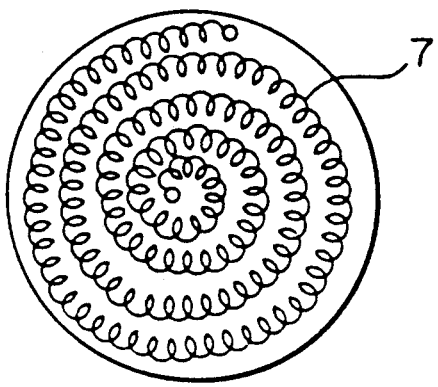
FIG. 3 is a plan view of a heater shown in FIG. 2.
Figure 4A:
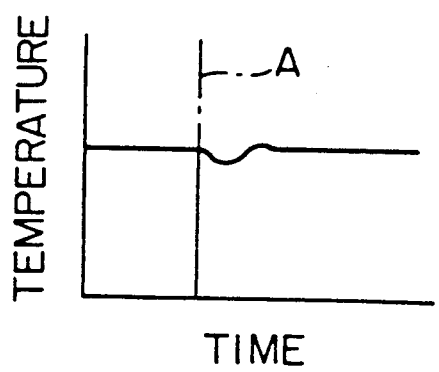
FIGS. 4 (a) and 4 (b) are graphs showing a relationship between time and the temperature of the heating stages with thin and thick equalizing plates incorporated therein respectively, which varies as the heating stages are subjected to disturbances.
Figure 4B:
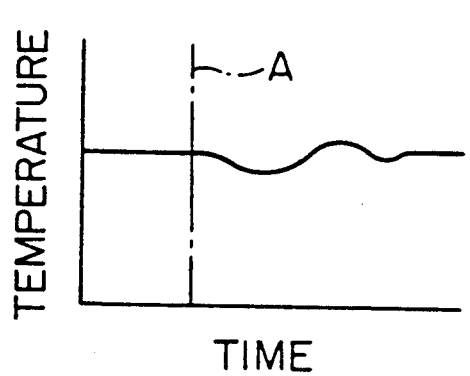
Figure 9:
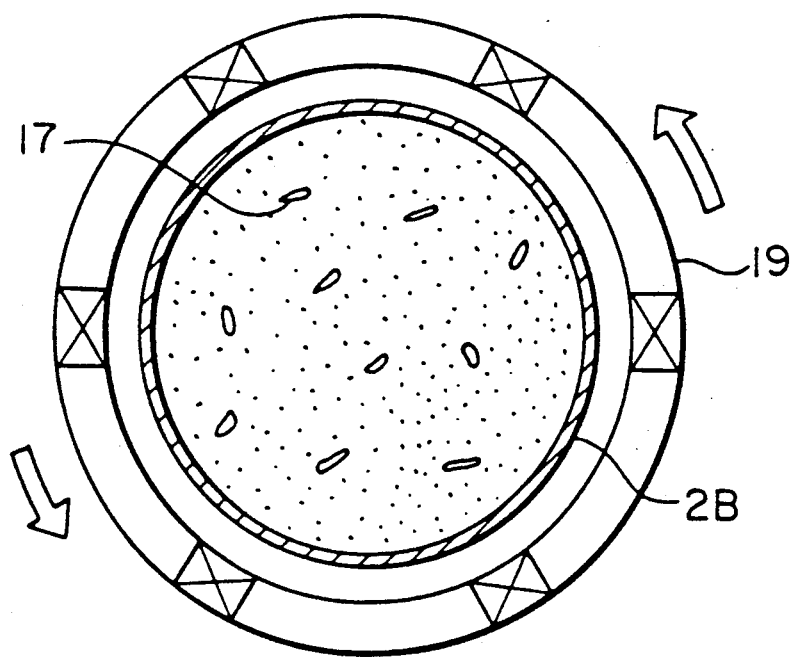
FIG. 9 is a cross-sectional view of a heating stage with a coil disposed around it.

In the second embodiment, the mercury 14 is employed as an electrically conductive fluid having an excellent heat conductivity. However, another fluid having an excellent heat conductivity may also be employed. Further, the above-described embodiment employs the magnet ring 18 to generate a rotary magnetic field in the mercury 14. However, the magnet ring may be replaced by a coil 19 of an inductive motor such as that shown in FIG. 9. The coil 19 is disposed around the heating stage 2B so that a rotary magnetic field can be applied to the mercury 14 from an alternating power source to rotate the mercury 14. This results in the provision of a semiconductor wafer heating device which is capable of heating a semiconductor wafer uniformly, which requires a small heat retaining capacity, and which ensures easy temperature control. When an electrically conductive fluid is rotated by a rotary magnetic field, since no movable member such as a rotary propeller exposed to a high temperature is disposed in the inner space, the heating stage can be made thinner. This allows a reliable and inexpensive semiconductor wafer heating device to be provided.

What is claimed is:

1. A semiconductor wafer heating device comprising:
   a hollow heating stage having opposed first and second surfaces, the first surface for supporting a semiconductor wafer;
   an electrically conducting fluid of relatively high thermal conductivity disposed within the hollow heating stage;
   a magnet movable relative to said stage for generating a rotating magnetic field within said stage directly coupled to said electrically conductive fluid to stir said fluid; and
   heating means disposed on the second surface of said heating stage for heating the stage.

2. The semiconductor wafer heating device according to claim 1 wherein said magnet comprises a rotating magnetic ring disposed circumferentially around said heating stage.

3. The semiconductor wafer heating device according to claim 1, wherein said electrically conductive fluid is mercury.

4. The semiconductor wafer heating device according to claim 1 including fins disposed within the hollow heating stage.

5. The semiconductor wafer heating device according to claim 4 wherein said electrically conductive fluid is mercury.

* * * * *